United States Patent [19]

Toyama et al.

[11] Patent Number: 4,996,135

[45] Date of Patent: Feb. 26, 1991

[54] DESENSITIZING GUM LITHOGRAPHIC PLATE FINISHER

[75] Inventors: Tadao Toyama; Kenji Kunichika, both of Shizuoka; Norio Hishiki; Masahiro Nishida, both of Osaka, all of Japan

[73] Assignee: Fuji Photo Film Co., Ltd., Minami-Ashigara, Japan

[21] Appl. No.: 425,034

[22] Filed: Oct. 23, 1989

[30] Foreign Application Priority Data

Oct. 24, 1988 [JP] Japan ................................ 63-267543

[51] Int. Cl.[5] ................................................ G03F 7/00

[52] U.S. Cl. .................................... 430/309; 101/466; 106/2; 106/210; 106/211

[58] Field of Search ..................... 101/466; 106/2, 210, 106/211; 430/309

[56] References Cited

U.S. PATENT DOCUMENTS

| | | | |
|---|---|---|---|
| 4,399,243 | 8/1983 | Dixit et al. | 430/949 |
| 4,719,172 | 1/1988 | Matsumoto et al. | 430/302 |

*Primary Examiner*—Marion E. McCamish
*Assistant Examiner*—J. Weddington
*Attorney, Agent, or Firm*—Burns, Doane, Swecker & Mathis

[57] ABSTRACT

A desensitizing gum lithographic plate finisher comprises water-soluble starch modified with urea-phosphoric acid containing 0.01 to 3% by weight of bound phosphorus and having a viscosity determined on 20% by weight aqueous solution at 30° C. ranging from 15 to 300 cps. The plate finisher can also be used as an aqueous phase of an emulsion type plate finisher. The finisher has high desensitizing ability and excellent low temperature storability and does not cause any reduction in the ink receptivity of image areas of lithographic printing plates.

20 Claims, No Drawings

DESENSITIZING GUM LITHOGRAPHIC PLATE FINISHER

BACKGROUND OF THE INVENTION

The present invention relates to a desensitizing gum lithographic plate finisher and more specifically to a desensitizing gum lithographic plate finisher which has high hydrophilization capacity and excellent low temperature storability and which does not cause any reduction in the ink receptivity of image areas of lithographic printing plates.

Upon manufacturing a lithographic printing plate, a gumming up step is performed as the final process. In the gumming up step, a protecting agent, i.e., so-called desensitizing gum is applied onto the surface of the printing plate. This is applied to the plate for the purposes of preventing adhesion of contaminants on the plate after the plate is manufactured and till the plate is set on a printing press to thereby prevent occurrence of background contamination on printed matters and for preventing the formation of defects on the plate surface during storing the plates in the heaped up state or upon hitting them against a foreign substance. The most important purpose of the gumming up step is to prevent the lowering of the hydrophilic properties of non-image areas due to oxidization encountered when the plate surface is directly exposed to air and to enhance the hydrophilic properties thereof. For this reason, the gumming up is a step indispensable for the plate making process.

As a gumming solution, there has been used, for a long time, a composition comprising an aqueous solution of gum arabic having a concentration ranging from about 15 to 30% by weight to which additives such as surfactants, pH-adjusting agents and preservatives are optionally added.

However, gum arabic is a natural substance which is produced only in limited regions in the world and its amount of harvest is greatly influenced by various factors such as the climate at the regions. Thus the stable supply thereof is not always expected. Moreover, the desensitizing ability of gum arabic is so strong that the ink receptivity of image areas is often lowered. Therefore, it is sometimes observed that many unacceptale printed matters are formed till those having satisfactory ink concentration are surely obtained during printing operations.

Under such circumstances, many attempts have been directed to the use of a variety of water-soluble polymeric compounds as desensitizing gum lithographic plate finishers capable of replacing gum arabic.

For instance, Japanese Patent Un-examined Publication (hereunder referred to as "J.P. KOKAI") No. Sho 54-97102 (B.P. 2010298) discloses dextrin, sterabic, arabogalactan, alginic acid salts, polyacrylic acids, hydroxyethyl cellulose, polyvinyl pyrrolidone, polyacrylamide, methyl cellulose, hydroxypropyl cellulose, hydroxymethyl cellulose and salts of carboxyalkyl celluloses. Moreover, Japanese Patent Publication for Opposition Purpose to as "J.P. KOKOKU") No. Sho 54-41921 discloses pullulan and pullulan derivatives; J.P. KOKAI No. Sho 58-197091 discloses polyvinyl pyrrolidone; and J.P. KOKAI No. Sho 56-133193 (U.S. Pat. No. 4,349,391) discloses polyvinyl alcohols. However, all of these polymeric compounds are inferior in the ability to desentize non-image areas to that of gum arabic.

In addition, it is proposed to use modified starches such as carboxyalkylated starches as disclosed in J.P. KOKAI Nos. Sho 62-7595(U.S. Pat. No. 4,731,119) and Sho 629995 and phosphated starches as disclosed in J.P. KOKAI Nos. Sho 62-11692 and Sho 62-11693 (U.S. Pat. No. 4,719,172), as the desensitizing gum lithographic plate finishers in order to improve the desensitizing ability of a desensitizing gum.

However, if such modified starches as carboxyalkylated and phosphated starches are used as the desensitizing gum lithographic plate finishers, it is often observed that these starches undergo aging to thus separate out from the solution containing the same when the solutions are stored at a low temperature for a long time period and hence they cannot serve as the desensitizing gum lithographic plate finishers.

These modified starches show excellent desensitizing ability, but are inferior in the desensitizing ability to gum arabic under severe conditions which are encountered, for instance, when a developer is deteriorated to cause the reduction in its dissolving out capacity or when a part of the light-sensitive layer to be dissolved out still remains on non-image areas of a developed presensitized plate (hereunder referred to as "PS plate") for use in making lithographic printing plate due to the reduction in developability of a PS plate with time.

SUMMARY OF THE INVENTION

Accordingly, an object of the present invention is to provide a desensitizing gum lithographic plate finisher (hereunder referred to as "plate finisher") having good desensitizing ability.

Another object of the present invention is to provide a plate finisher which does not cause any reduction in the ink receptivity of image areas.

A further object of the present invention is to provide a plate finisher which is excellent in storability at a low temperature.

The inventors of this invention have conducted various studies to achieve the aforementioned objects and have found that the foregoing objects can be quite effectively attained by using a starch modified with urea-phosphoric acid as a hydrophilic organic polymeric compound. Thus, the present invention has been completed.

According to the present invention, there is provided a plate finisher for lithographic printing plates which comprises watersoluble starch modified with urea-phosphoric acid, containing 0.01 to 3% by weight of bound phosphorus and having a viscosity determined on 20% by weight aqueous solution at 30° C. ranging from 15 to 300 cps.

DETAILED EXPLANATION OF THE INVENTION

The starches modified with urea-phosphoric acid (hereunder referred to as "urea-phosphated starches") used in the invention may be prepared in an ordinary manner which comprises adding, to a starch, a phosphoric acid such as othrophosphoric acid, pyrophosphoric acid, trimetaphosphoric acid, hexametaphosphoric acid, polyphosphoric acid, phosphoric acid anhydride, phosphorous acid, phosphorous oxychloride, organic phosphonic acids or a salt thereof and urea or thiourea and mixing them and then heating the mixture.

In the method for preparing the urea-phosphated starches used in the invention, the hydrolysis of the starch molecules can effectively be promoted by optionally adding an inorganic acid such as hydrochloric acid, nitric acid or sulfuric acid or an organic acid during the preparation. Moreover, the starch molecules are esterified (through hydroxyl group of the starch molecule) or hydrolyzed by adding, during the reaction, a dicarboxylic acid such as succinic acid, glutaric acid or adipic acid; an unsaturated dicarboxylic acid such as maleic acid or itaconic acid; an oxy-, di- or tricarboxylic acid such as tartaric acid or citric acid; or an aromatic dicarboxylic acid such as phthalic acid; or an anhydride thereof. The urea-phosphated starches thus obtained may also be effectively used in the invention.

The starches used as the starting material for the urea-phosphated starches are, for instance, those derived from potato, sweet potato, cassaba, wheat, corn, waxy corn, rice and glutinous rice.

The degree of phosphate esterification of the urea-phosphated starches used in the invention can be expressed in the amount of phosphorous bonded to starch (hereunder referred to as "bound phosphorus"). The method for quantitatively analyzing the bound phosphorus is detailed in "SHOKUHIN TENKABUTSU KOTEISHO KAISETSUSHO, DAI 4-PAN, 1979 (Descriptive Japanese Standards of Food Additives, 4th Ed., 1979, pp. B674–B675, issued by HIROKAWA BOOK COMPANY). The amount of the bound phosphorus of the urea-phosphated starches suitably used in the invention, as determined by the aforementioned method, ranges from 0.01 to 3% by weight, in particular 0.05 to 1.5% by weight. This is because if the amount of the bound phosphorus is less than the lower limit, sufficient desensitizing ability cannot be attained. Moreover, if it is more than the upper limit, further improvement of desensitizing ability is not observed, a large amount of a phosphoric acid compound is required for the reaction and it also takes a long time period for completing the reaction, which makes the reaction less economical.

The urea-phosphated starches used in the invention have a viscosity determined on 20% by weight aqueous solution thereof at 30° C. (measured with a Brookfield Viscometer (BM type viscometer)) ranging from 15 to 300 cps. Preferred viscosity thereof ranges from 30 to 200 cps. If the viscosity thereof is less than the lower limit, sufficient desensitizing ability cannot be attained, while if it is more than the upper limit, the viscosity of the resultant plate finisher becomes too high to easily handle it and to obtain a uniform coated surface.

The amount of urea added during the phosphate esterification reaction ranges from 5 to 40% by weight, in particular 10 to 25% by weight on the basis of the total weight of the starting starch. If the amount of urea is less than the lower limit, the resulting plate finisher is liable to cause aging during low temperature storage.

The term "water-soluble" herein used encompasses not only "cold water-soluble" but also "hot water-soluble".

The content of the urea-phosphated starches in the plate finisher of the present invention is preferably about 0.1 to 40% by weight and more preferably 0.5 to 25% by weight based on the total weight of the plate finisher.

The plate finishers of this invention may simultaneously comprise other water-soluble organic polymeric compounds. Examples of such polymeric compounds are cellulose derivatives such as methyl cellulose, ethyl cellulose, hydroxyethyl cellulose and carboxymethyl cellulose; processed starches such as roasted dextrin, enzyme-modified dextrin, oxidized starches, acid-treated starches, pregelatinized starches, esterified starches, etherified starches and cross-linked starches; and natural or semisynthetic polymeric compounds such as D-sorbit, alginic acid salts, locust bean gum, sterabic, arabogalactan and pullulan. Moreover, the polymeric compounds simultaneously used in the plate finisher may further include, for instance, synthetic polymeric compounds such as polyvinyl alcohol, polyvinyl pyrrolidone, polyacrylamides, polyvinyl methyl ether, polyethylene oxide, a copolymer of vinyl methyl ether with maleic anhydride and a copolymer of vinyl acetate with maleic anhydride. In addition, gum arabic may be used in combination with the foregoing components in the plate finisher of the invention and the object of the present invention may be achieved by using gum arabic in an amount extremely lower than that conventionally used.

In general, the plate finisher is preferably used in the acid region, i.e., at a pH ranging from 2.5 to 6. The pH value is generally adjusted by adding a mineral acid, an organic acid, an inorganic salt or the like to the plate finisher. The amount thereof generally ranges from 0.01 to 2% by weight.

Useful examples of the foregoing organic acids are citric acid, acetic acid, oxalic acid, malonic acid, p-toluenesulfonic acid, tartaric acid, malic acid, lactic acid, levulinic acid and organophosphonic acids and those of the mineral acids are nitric acid, sulfuric acid and phosphoric acid.

The foregoing mineral acids, organic acids or inorganic salts may be used alone or in combination.

The surface conditions or the like of the resulting coated film can be improved by adding a surfactant to the plate finisher of the present invention. Examples of the surfactants usable herein include anionic, cationic, amphoteric and nonionic surfactants.

Examples of such anionic surfactants include sulfuric acid ester salts of aliphatic alcohols, phosphoric acid ester salts of aliphatic alcohols, sulfonic acid salts of dibasic fatty acid esters, sulfonic acid salts of aliphatic acid amides, alkylaryl sulfonic acid salts, and naphthalenesulfonic acid salts condensed with formaldehyde.

Examples of the cationic surfactants usable in the invention are alkylamine salts and quaternary ammonium salts.

Examples of the amphoteric surfactants are alkylcarboxy betaines and alkylimidazolines.

Examples of the nonionic surfactants usable in the invention are polyethylene glycol alkylesters, polyethylene glycol alkylethers, sorbitan alkylesters and polyoxypropylene polyoxyethylene ethers.

The surfactants may be used alone or in combination. The amount thereof used is not limited to a specific range, but preferably it ranges from 0.01 to 10% by weight on the basis of the total weight of the plate finisher.

In addition to the foregoing components, the plate finisher may further comprise a lower polyhydric alcohol such as glycerin, ethylene glycol and triethylene glycol as a lubricant. The amount of the lubricant preferably ranges from 0.1 to 5.0% by weight, more preferably 0.5 to 3.0% by weight based on the total weight of the plate finisher. Moreover, the plate finisher may comprise other additives such as preservatives. Examples thereof are benzoic acid and derivatives thereof, phenol, formalin, sodium dehydroacetate and isothiazolone type compounds. These compounds may be used in an amount ranging from 0.005 to 2.0% by weight of the plate finisher.

The plate finisher of the present invention containing the ureaphosphated starch is superior in the ink receptivity of image areas to those mainly comprising gum arabic. There has been known an emulsion type plate finisher comprising an oil phase which comprises petroleum cut containing an organic solvent-soluble lipophilic substance such as a lipophilic surfactant and an aqueous phase containing a hydrophilic polymeric compound. The present invention may also be applied to such an emulsion type plate finisher. In this case, the aqueous phase may comprise the urea-phosphated starch and other various hydrophilic organic polymeric compounds simultaneously. Examples of such hydrophilic organic polymeric compounds are cellulose derivatives such as methyl cellulose, ethyl cellulose, hydroxyethyl cellulose and carboxymethyl cellulose; processed starches such as roasted dextrin, enzyme-modified dextrin, oxidized starches, acid-treated starches, pregelatinized starches, esterified starches, etherified starches and cross-linked starches; and natural or semisynthetic polymeric compounds such as D-sorbit, alginic acid salts, locust bean gum, sterabic, arabogalactan and pullulan. Moreover, the polymeric compounds simultaneously used in the aqueous phase of the emulsion type plate finisher may further include, for instance, synthetic polymeric compounds such as polyvinyl alcohol, polyvinyl pyrrolidone, polyacrylamides, polyvinyl methyl ether, polyethylene oxide, a copolymer of vinyl methyl ether with maleic anhydride and a copolymer of vinyl acetate with maleic anhydride. In addition, gum arabic may also be used simultaneously in the aqueous phase of the emulsion type plate finisher of the invention and the object of the present invention can be achieved by using gum arabic in an amount extremely lower than that conventionally used.

The hydrophilic polymeric compounds may be added to the aqueous phase in a wide range of concentration, but in general they are used in an amount ranging from about 5 to about 40% by weight, preferably 10 to 30% by weight on the basis of the total weight of the plate finisher. Their concentration in the aqueous phase ranges from about 6 to about 60% by weight, preferably 15 to 50% by weight.

The aqueous phase preferably comprises a wetting agent. Whereby the aqueous phase of the plate finisher of the invention can properly be spread on the non-image areas of lithographic printing plates. Preferred examples of such wetting agents include polyhydric alcohols. Preferred specific examples thereof are ethylene glycol, diethylene glycol, triethylene glycol, propylene glycol, butylene glycol, pentanediol, hexylene glycol, tetraethylene glycol, polyethylene glycol, dipropylene glycol, tripropylene glycol, glycerin, sorbitol and pentaerythritol, in particular glycerin. The wetting agent may be used in an amount ranging from about 0.5 to about 10% by weight, preferably 1 to 5% by weight on the basis of the total weight of the plate finisher.

The emulsion type plate finisher can be obtained by emulsifying the foregoing aqueous phase with an oil phase comprising an organic solvent and a surfactant dissolved therein. Examples of the organic solvents used in this case are petroleum cut, phthalic acid diesters such as dibutyl phthalte, diheptyl phthalate, di-n-octyl phthalate, di-(2-ethylhexyl) phthalate, dinonyl phthalate, didecyl phthalate, dilauryl phthalate and butyl benzyl phthalate; aliphatic dibasic acid esters such as dioctyl adipate, butyl glycol adipate, dioctyl azelate, dibutyl sebacate, di-(2-ethylhexyl) sebacate and dioctyl sebacate; epoxylated triglycerides such as epoxylated soybean oil; phosphate esters such as tricresyl phosphate, trioctyl phosphate and trischloroethyl phosphate; and benzoic acid esters such as benzyl benzoate. Particularly preferred are dioctyl adipate, dibutyl sebacate and dioctyl azelate which do not give out bad smell and are highly safe.

These organic solvent may be used alone or in combination and the amount thereof ranges from about 0.1 to about 10% by weight, in particular 0.5 to 5.0% by weight on the basis of the total weight of the plate finisher of this invention.

The oil phase preferably comprises a lipophilic substance. Whereby the stability of the plate finisher of the invention in the form of an emulsion is further improved and the reduction in the ink receptivity of image areas can be restricted to a very low level. Examples of preferred lipophilic substances include lipophilic resins which are used as vehicles for inks used in the lithographic printing and more specifically novolak type phenol resins such as phenol-formaldehyde resin; cresol-formaldehyde resin, t-butylphenol-formaldehyde resin; xylene resin obtained by condensing phenol and xylene with formaldehyde, a resin obtained by condensing phenol and mesitylene with formaldehyde, polyhydroxystyrene, brominated polyhydroxystyrene, cashew resin, partially esterified copolymer of styrene and maleic anhydride, melamine resin, alkyd resin, polyester resin, epoxy resin, rosin, modified rosin such as hydrogenated rosin, polymerized rosin esters and rosin esters; and petroleum resins such as gilsonite. Particularly preferred are novolak type phenol resins, rosin and modified rosins. Examples of other preferred lipophilic substances are organic carboxylic acids having 5 to 25 carbon atoms such as oleic acid, lauric acid, valeric acid, nonylic acid, capric acid, myristic acid and palmitic acid; and castor oil. These lipophilic substances may be used alone or in combination and the amount thereof used ranges from about 0.05 to about 5% by weight, preferably 0.1 to 1% by weight on the basis of the total weight of the plate finisher of this invention.

Moreover, the oil phase comprises a surfactant as an emulsifying agent which may be any surfactant. Examples of such surfactants are nonionic surfactants such as polyoxyethylene alkyl ethers, polyoxyethylene alkylphenyl ethers, polyoxyethylene fatty acid esters, sorbitan fatty acid esters, polyoxyethylene sorbitan fatty acid esters and glycerin fatty acid esters; anionic surfactants such as fatty acid salts, alkylsulfate ester salts, alkylbenzenesulfonic acid salts, alkylnaphthalene sulfonic acid salts, dialkylsulfosuccinic acid salts, alkylphosphoric acid ester salts, naphthalenesulfonic acidformalin condensate and polyoxyethylene alkylsulfuric acid ester salts; cationic surfactants such as alkylamine salts, quaternary ammonium salts and polyoxyethylene alkylamine salts. Among these, preferred are polyoxyethylene alkyl ethers, polyoxyethylene alkylphenyl ethers, dialkylsulfosuccinic acid salts, alkylphosphoric acid ester salts and polyoxyethylene alkylamine salts since these surfactants have an effect of suppressing the reduction in the ink receptivity of the image areas on a lithographic printing plate like the foregoing lipophilic substances. Particularly preferred is polyoxyethylene alkylphenyl ether. These surfactants may be used alone or in combination. In particular, the use of the combination of polyoxyethylene alkylphenyl ether and a dialkylsulfosuccinic acid ester salt is a preferred example of such simultaneous use of surfactants since in such case, synergistic effect between the stabilization of the emulsion and the suppression of the reduction in the ink receptivity of image areas can be expected. The surfactants can be used in an amount ranging from about 0.5 to about 10% by weight, preferably 1 to 5% by weight based on the total weight of the plate finisher of this invention. The oil phase thus prepared is dropwise added to the aqueous phase with stirring and the resulting mixed liquid is further emulsified with a homogenizer to obtain the plate finisher of the present invention.

The plate finisher of this invention may be applied to various kinds of lithographic printing plates, in particular the plate finisher can suitably be applied to those obtained by imagewise exposing a PS plate comprising an aluminum substrate provided thereon with a light-sensitive layer and then developing the same. Examples of preferred such PS plates include those comprising an aluminum substrate provided thereon with a light-sensitive layer composed of a mixture of a diazo resin (a salt of a condensate of p-diazodiphenylamine and paraformaldehyde) and shellac as disclosed in British Pat. No. 1,350,521; negative working PS plates such as those comprising an aluminum substrate provided thereon with a light-sensitive layer composed of a mixture of a diazo resin and a polymer mainly composed of repeating units derived from hydroxyethyl methyacrylate or hydroxyethyl acrylate as disclosed in British Pat. Nos. 1,460,978 and 1,505,739; and positive working PS plates such as those comprising an aluminum substrate provided thereon with a light-sensitive layer composed of a mixture of o-quinonediazide light-sensitive substance and a novolak type phenol resin as disclosed in J.P. KOKAI No. Sho 50-125806. Preferred examples of such PS plates further include PS plates comprising an aluminum substrate provided thereon with a light-sensitive layer composed of a photocrosslinkable photopolymer specifically described in U.S. Pat. No. 3,860,426; PS plates comprising an aluminum plate provided thereon with a light-sensitive layer composed of a photopolymerizable photopolymer composition as disclosed in U.S. Pat. Nos. 4,072,528 and 4,072,527; and PS plates comprising an aluminum plate provided thereon with a light-sensitive layer composed of a mixture of an azide and a water-soluble polymer as disclosed in British Pat. Nos. 1,235,281 and 1,495,861.

A method for treating a PS plate (in fact a lithographic printing plate) with a plate finisher will hereunder be explained as an example of the method for using the plate finisher of the present invention.

First, a PS plate is imagewise exposed to light and then developed to obtain a lithographic printing plate. The lithographic printing plate is washed with water, followed by squeezing out water on the plate surface, pouring a plate finisher on the plate surface in a proper amount and then rubbing the plate so as to coat the finisher on the whole surface thereof uniformly. Whereby the non-image areas on the plate surface is protected and thus the lithographic printing plate can be stored stably even at a low temperature. Upon starting the printing operations, the gum layer is removed by washing with water and thereafter the printing operations can be performed according to ordinary procedures. Alternatively, the plate finisher may be uniformly applied onto the surface of a lithographic printing plate with an automatic gum coater or the like.

The plate finisher of the present invention can likewise be suitably used in various cases, for instance, a case wherein a PS plate is developed with an automatic developing machine and, immediately thereafter, the plate finisher is supplied onto the whole surface of the plate to coat the same without washing with water; a case wherein a PS plate is developed and the plate finisher is applied to the developed PS plate immediately after rinsing the plate with an aqueous solution containing a surfactant or after washing the rinsed plate; a case wherein the plate finisher is applied after developing a PS plate and washing it with circulating washing water; and a case wherein the plate finisher is applied onto the plate surface after developing a PS plate, washing it with circulating washing water and then treating it with an aqueous solution containing a surfactant.

The plate finisher of the present invention can suitably be used as a plate surface protecting agent used after baking a lithographic printing plate to strengthen the image areas thereof or as that used for leaving a lithographic plate on a printing press.

The plate finisher of the present invention can preferably be used to protect lithographic printing plates obtained by processing negative working and positive working PS plates in the same developer. The lithographic printing plates protected with the plate finisher of this invention can provide fully satisfactorily clear printed matters, during printing, immediately after the initiation of printing operations without providing a great deal of unacceptable printed matters observed when a conventional plate finisher is used.

The present invention will hereunder be explained in more detail with reference to the following non-limitative working Examples and the effect practically achieved by the present invention will also be discussd in detail in comparison with Comparative Examples.

In the following Examples and Comparative Examples, the term "%" means "% by weight" unless otherwise specified.

EXAMPLES 1 to 21 AND COMPARATIVE EXAMPLES 1 to 3

Plate finishers having the compositions detailed below were prepared.

(Composition of the Plate Finisher)

| Component | Amount (part by weight) |
|---|---|
| Various urea-phosphated starches listed in Table I or three kinds of water-soluble polymeric compounds as comparative examples | 60 |
| Hydroxypropylated enzyme-modified dextrin (PENON JE-66, available from NICHIDEN CHEMICAL CO., LTD.) | 80 |
| Sodium isopropylnaphthalene sulfonate (35% aqueous solution) | 5 |
| Sodium dehydroacetate | 0.3 |
| Pure water | 1000 |

*The pH value was adjusted to 3.5 using 85% phosphoric acid.

An aluminum plate having a thickness of 0.24 mm was degreased by immersing it in 7% aqueous solution of tertiary sodium phosphate maintained at 60° C., washed with water and rubbed with a nylon brush with pouring an aqueous suspension of pumice stone to carry out graining. After washing with water, it was immersed in 5% aqueous solution of potassium silicate (molar ratio, $SiO_2/K_2O$, =2.0) maintained at 70° C. for 30 to 60 seconds. After sufficiently washing with water, the aluminum plate was dried.

The aluminum substrate thus treated was coated with a solution of a light-sensitive composition (hereunder referred to as "light-sensitive solution") comprising 2.0 parts by weight of 2-hydroxyethyl methacrylate copolymer (synthesized according to the method disclosed in Example 1 of British Pat. No. 1,505,739), 0.12 part by weight of 2-methoxy-4-hydroxy-5-benzoylbenzenesulfonic acid salt of a condensate of p-diazodiphenylamine and paraformaldehyde, 0.03 part by weight of Oil Blue #603 (available from ORIENT CHEMICAL INDUSTRIES CO., LTD.), 15 parts by weight of 2-methoxyethanol, 10 parts by weight of methanol and 5.0 parts by weight of ethylene chloride to obtain a PS plate having a coated amount of the light-sensitive layer of 1.8 g/m$^2$ (weighed after drying). The PS plate was exposed to light through a halftone dot negative transparency, developed with a developer comprising 3.0 parts by weight of sodium sulfite, 30.0 parts by weight of benzyl alcohol, 20.0 parts by weight of triethanolamine, 5 parts by weight of monoethanolamine, 10 parts by weight of sodium t-butylnaphthalenesulfonate and 1000 parts by weight of pure water, then washed with water and dried. The surface of the lithographic printing plate was coated with each of the foregoing plate finishers by rubbing the surface with a sponge containing the finisher and the excess thereof was wiped away with a cloth to thus obtain lithographic printing plate Samples for printing.

These Samples were previously allowed to stand for 3 days at a temperature of 35° C. and a relative humidity (RH) of 85% to evaluate the ink receptivity and the desensitizing ability of these lithographic printing plate Samples. Each Sample was set on a printing press HAMADASTAR 900 CD-X offset press and printing operations were started in an ordinary manner. The number of spoiled printed matters before acceptable clear printed matters were obtained was determined and listed on the column of ink receptivity in the following Table I. The printing operation was further continued till 1000 printed matters was obtained and at this stage the supply of dampening water and printing paper was stopped, an ink was adhered to the whole surface of the lithographic printing plate Sample and then the printing operation was performed under usual printing conditions. According to the method for evaluation, when a lithographic printing plate Sample in which a plate finisher having a strong desensitizing ability such as gum arabic was used, the ink on the non-image areas was immediately wiped away (in other words, it was removed), although the ink receptivity of the gum arabic was extremely low and 40 printed matters were spoiled before acceptable printed matters were obtained. However, in Comparative Examples 2 and 3, the ink on the non-image areas could not be removed easily and 25 printed matters were spoiled before acceptable printed matters were obtained.

The urea-phosphated starches were excellent in ink receptivity and their desensitizing ability was good except for those having a low content of the bound phosphorus and/or a low viscosity.

Then, to examine the low temperature storability of the plate finishers, each of 24 kinds of plate finishers listed in Table I was packed in a polymer bottle and a cycle of freezing and thawing of the bottled Samples (24 hours each) was repeated 5 times. The plate finisher of Comparative Example 4 formed a white gel-like substance.

TABLE I

| | Urea-Phospated Starch | | | Result of Printing Test | | Storability |
|---|---|---|---|---|---|---|
| Ex. No. | Urea added (wt %) | Bound P (wt %) | Visc. (cps) | I.R. (num.) | Desensitizing ability | at low Temp (aging) |
| 4* | 5 | 0.6 | 11 | 8 | C | D |
| 1 | 10 | 0.5 | 23 | 8 | B | C |
| 2 | 15 | 0.6 | 30 | 8 | A | A |
| 3 | 20 | 0.5 | 28 | 8 | A | A |
| 4 | 25 | 0.6 | 40 | 8 | A | A |
| 5 | 30 | 0.7 | 48 | 8 | A | A |
| 6 | 40 | 0.8 | 55 | 8 | A | A |
| 5* | 15 | 0 | 65 | 9 | D | A |
| 7 | 15 | 0.01 | 52 | 8 | C | A |
| 8 | 15 | 0.06 | 65 | 8 | B | A |
| 9 | 15 | 0.3 | 42 | 8 | A | A |
| 10 | 15 | 0.6 | 52 | 8 | A | A |
| 11 | 15 | 1.1 | 39 | 8 | A | A |
| 12 | 15 | 1.5 | 63 | 8 | A | A |
| 13 | 15 | 3.0 | 38 | 8 | A | A |
| 14 | 15 | 0.30 | 14 | 8 | C | A |
| 15 | 15 | 0.33 | 25 | 8 | B | A |
| 16 | 15 | 0.31 | 39 | 8 | A | A |
| 17 | 15 | 0.28 | 75 | 8 | A | A |
| 18 | 15 | 0.35 | 135 | 10 | A | A |
| 19 | 15 | 0.33 | 220 | 10 | A | A |
| 1* | gum arabic | | | 40 | A | A |
| 2* | roasted dextrin (Cream Dextrin #5, MATSUTANI CHEMICAL CO., LTD.) | | | 9 | D | A |
| 3* | enzyme-modified starch (AMICOL 7H, NICHIDEN CHEMICAL CO., LTD.) | | | 8 | D | A |

*Comparative Examples.
The amount of urea added is expressed on the basis of the starting starch.
I.R. means "ink receptivity" at the beginning of the printing. Evaluation Standard: A: good; B: moderate; C: slightly inferior; D: inferior. As the starting starch for the urea-phosphated starch, waxy corn starch is used.

EXAMPLE 20

There were dissolved, in 790.8 parts by weight of pure water, 50 parts by weight of an urea-phosphated starch (starting material: potato starch; amount of urea added: 15% bound phosphorus: 1.1%; viscosity of 20% aqueous solution measured at 30° C.: 45 cps), 90 parts by weight of D-sorbit, 5.0 parts by weight of 40% aqueous solution of sodium alkyldiphenyl ether disulfonate, 0.2 part by weight of p-oxybenzoic acid ether, 2.0 parts by weight of citric acid and 2.0 parts by weight of secondary ammonium phosphate to prepare a plate finisher.

On the other hand, a light-sensitive solution was prepared by dissolving, in 40 parts by weight of methyl cellosolve, 1 part by weight of naphthoquinone-1,2-diazide-5-sulfonic acid ester of polyhydroxyphenyl obtained by polycondensing acetone and pyrogallol as disclosed in J.P. KOKOKU No. Sho 43-28403 and 2 parts by weight of novolak type cresol-formaldehyde resin.

A grained aluminum plate having a thickness of 0.2 mm was sufficiently washed and then dried. The foregoing light-sensitive solution was applied onto the surface of the aluminum plate with a whirler and then dried to thus obtain a positive working PS plate having a light-sensitive layer in an amount of about 2.0 g/m$^2$. The PS plate was exposed to light through a halftone dot positive transparency, developed with 3% aqueous solution of sodium silicate, washed with water and dried.

The lithographic printing plate thus prepared was cut into two pieces. The foregoing plate finisher Sample was applied to one of the pieces and the plate finisher Sample containing gum arabic used in Comparative Example 1 was applied onto the other of the pieces.

After storing these two Samples in a thermo-hygrostated chamber maintained at a temperature of 45° C. and a humidity of 85%, for 7 days, printing was performed in an usual manner using the Heidelberg KOR-D printing press.

As a rsult, both of these Samples provided 100,000 printed matters without causing background contamination. This clearly shows that Sample to which the plate finisher of the present invention was applied exhibits desensitizing ability identical with that of Sample to which the plate finisher comprising gum arabic was applied.

EXAMPLE 21

There were dissolved, in 720 parts by weight of pure water, 50 parts by weight of an urea-phosphated starch (starting material: waxy corn starch; amount of urea added: 20%; bound phosphorus: 0.60%; viscosity of 20% aqueous solution measured at 30° C.: 80 cps), 100 parts by weight of yellow dextrin (Cream Dextrin #5; available from MATSUTANI CHEMICAL CO., LTD.) and 0.2 part by weight of p-oxybenzoic acid ester and pH of the resulting solution was adjusted to 3.5 using 85% phosphoric acid solution to thus obtain an aqueous phase for an emulsion type plate finisher.

Then an oil phase for the emulsion type plate finisher was prepared from 12 parts by weight of dibutyl sebacate, 25 parts by weight of sodium dilaurylsulfosuccinate and 5 parts by weight of sorbitan monolaurate, followed by gradually adding the oil phase to the foregoing aqueous phase and emulsifying the mixture with a homogenizer to obtain a plate finisher Sample. This emulsion was stable even if it was allowed to stand for one week and hence did not cause phase separation.

The PS plate used in Example 20 exposed to light through a halftone dot positive transparency, developed with 3% aqueous solution of sodium silicate, washed with water and dried.

The lithographic printing plate thus obtained was coated with the plate finisher Sample and then printing was performed in an usual manner using the Heidelberg KOR-D printing press. As a result, 100,000 printed matters were obtained from the beginning of the printing operation without causing background contamination.

As have been clearly demonstrated in the foregoing Examples and Comparative Examples, the plate finisher of the present invention is excellent in the desensitizing ability and does not deteriorate the ink receptivity of image areas. Therefore, the lithographic printing plate to which the plate finisher of this invention is applied has good ink receptivity from the beginning of the printing operation. Moreover, the plate finisher of the invention is excellent in the low temperature storability.

What is claimed is:

1. A gumming-up process comprising applying to an imagewise exposed and developed presensitized plate, a desensitizing gum lithographic plate finish which comprises water-soluble starch modified with urea-phosphoric acid, containing 0.01 to 3% by weight of bound phosphorus and having a viscosity determined on 20% by weight aqueous solution at 30° C. ranging from 15 to 300 cps.

2. The process of claim 1 wherein the amount of the starch modified with urea-phosphoric acid ranges from about 0.1 to 40% by weight on the basis of the total weight of the finisher.

3. The process of claim 2 wherein the amount of the starch modified with urea-phosphoric acid ranges from about 0.5 to 25% by weight on the basis of the total weight of the finisher.

4. The process of claim 1 wherein the amount of the bound phosphorus ranges from 0.05 to 1.5% by weight.

5. The process of claim 1 wherein the viscosity of the 20% aqueous solution of the water-soluble starch modified with urea-phosphoric acid ranges from 30 to 200 cps.

6. The process of claim 1 wherein said gum further comprises at least one surfactant in an amount ranging from 0.01 to 10% by weight on the basis of the total weight of the finisher.

7. The process of claim 1 wherein said gum further comprises at least one lubricant selected from the group consisting of glycerin, ethylene glycol and triethylene glycol in an amount ranging from 0.1 to 5.0% by weight on the basis of the total weight of the finisher.

8. The process of claim 1 wherein said gum further comprises at least one other water-soluble organic polymer compound selected from the group consisting of methyl cellulose, ethyl cellulose, hydroxyethyl cellulose, carboxymethyl cellulose, roasted dextrin, enzyme-modified dextrin, oxidized starches, acid-treated starches, pregelatinized starches, esterified starches, etherified starches, cross-linked starches, D-sorbit, alginic acid salts, locust bean gum, sterabic, arabogalactan, pullulan, polyvinyl alcohol, polyvinyl pyrrolidone, polyacrylamides, polyvinyl methyl ether, polyethylene oxide, a copolymer of vinyl methyl ether with maleic anhydride and a copolymer of vinyl acetate with maleic anhydride.

9. The process of claim 1 wherein said gum further comprises gum arabic.

10. A gumming-up process comprising applying to an imagewise exposed and developed presensitized plate, an emulsion type desensitizing gum lithographic plate finisher which comprises an aqueous phase and an oil phase, wherein the aqueous phase comprises water-soluble starch modified with urea-phosphoric acid, containing 0.01 to 3% by weight of bound phosphorus and having a viscosity determined on 20% by weight aqueous solution at 30° C. ranging from 15 to 300 cps.

11. The process of claim 10 wherein the amount of the starch modified with urea-phosphoric acid ranges from about 0.1 to 40% by weight on the basis of the total weight of the finisher.

12. The process of claim 11 wherein the amount of the starch modified with urea-phosphoric acid ranges from about 0.5 to 25% by weight on the basis of the total weight of the finisher.

13. The process of claim 10 wherein the amount of the bound phosphorus ranges from 0.05 to 1.5% by weight.

14. The process of claim 10 wherein the viscosity of the 20% aqueous solution of the water-soluble starch modified with urea-phosphoric acid ranges from 30 to 200 cps.

15. The process of claim 10 wherein said gum further comprises at least one surfactant in an amount ranging from 0.01 to 10% by weight on the basis of the total weight of the finisher.

16. The process of claim 10 wherein said gum further comprises at least one wetting agent selected from the group consisting of glycerin, ethylene glycol, triethylene glycol diethylene glycol, propylene glycol, butylene glycol, pentanediol, hexylene glycol, tetraethylene glycol, polyethylene glycol, dipropylene glycol, tripropylene glycol, sorbitol and pentaerythritol in an amount ranging from 0.5 to 10% by weight on the basis of the total weight of the finisher.

17. The process of claim 10 wherein said gum further comprises at least one other water-soluble organic polymer compound selected from the group consisting of methyl cellulose, ethyl cellulose, hydroxyethyl cellulose, carboxymethyl cellulose, roasted dextrin, enzyme-modified dextrin, oxidized starches, acid-treated starches, pregelatinized starches, esterified starches, etherified starches, cross-linked starches, D-sorbit, alginic acid salts, locust bean gum, sterabic, arabogalactan, pullulan, polyvinyl alcohol, polyvinyl pyrrolidone, polyacrylamides, polyvinyl methyl ether, polyethylene oxide, a copolymer of vinyl methyl ether with maleic anhydride and a copolymer of vinyl acetate with maleic anhydride in an amount ranging from about 5 to about 40% by weight on the basis of the total weight of the finisher.

18. The process of claim 10 wherein said gum further comprises gum arabic.

19. The process of claim 10 wherein the oil phase comprises at least one lipophilic substance selected from the group consisting of phenol-formaldehyde resin, cresol-formaldehyde resin, t-butylphenol-formaldehyde resin; xylene resin obtained by condensing phenol and xylene with formaldehyde, a resin obtained by condensing phenol and mesitylene with formaldehyde, polyhydroxystyrene, brominated polyhydroxystyrene, cashew resin, partially esterified copolymer of styrene and maleic anhydride, melamine resin, alkyd resin, polyester resin, epoxy resin, rosin, hydrogenated rosin, polymerized rosin esters, rosin esters, gilsonite, oleic acid, lauric acid, valeric acid, nonylic acid, capric acid, myristic acid, palmitic acid and castor oil in an amount ranging from about 0.05 to about 5% by weight on the basis of the total weight of the plate finisher of this invention.

20. The process of claim 10 wherein the oil phase comprises at least one surfactant as an emulsifying agent selected from the group consisting of polyoxyethylene alkyl ethers, polyoxyethylene alkylphenyl ethers, polyoxyethylene fatty acid esters, sorbitan fatty acid esters, polyoxyethylene sorbitan fatty acid esters, glycerin fatty acid esters, fatty acid salts, alkylsulfate ester salts, alkylbenzene-sulfonic acid salts, alkylnaphthalene sulfonic acid salts, dialkyl-sulfosuccinic acid salts, alkylphosphoric acid ester salts, naphthalenesulfonic acid-formalin condensate, polyoxyethylene alkylsulfuric acid ester salts, alkylamine salts, quaternary ammonium salts and polyoxyethylene alkylamine salts in an amount ranging from about 0.5 to about 10% by weight based on the total weight of the plate finisher.

* * * * *